United States Patent [19]

Hanlon

[11] Patent Number: 5,229,771
[45] Date of Patent: Jul. 20, 1993

[54] ANALOG TO DIGITAL CONVERTER FOR CONVERTING MULTIPLE ANALOG INPUT SIGNALS TO CORRESPONDING DIGITAL OUTPUT SIGNALS DURING ONE CONVERSION CYCLE

[75] Inventor: Michael M. Hanlon, Santa Clara, Calif.

[73] Assignee: Integrated Semiconductor Solutions, San Jose, Calif.

[21] Appl. No.: 852,009

[22] Filed: Mar. 16, 1992

[51] Int. Cl.[5] .................. H03M 1/50; H03M 1/12
[52] U.S. Cl. ............................ 341/166; 341/167; 341/172; 341/128
[58] Field of Search ............... 341/166–170, 341/172, 128, 129, 141

[56] References Cited

U.S. PATENT DOCUMENTS

| | | | |
|---|---|---|---|
| 3,569,957 | 3/1971 | Masterson | 341/168 |
| 3,710,374 | 1/1973 | Kelly | 341/167 |
| 3,961,325 | 6/1976 | Kendall et al. | 341/167 X |
| 4,024,533 | 5/1977 | Neumann | 341/167 |
| 4,567,465 | 1/1986 | Komiya | |
| 4,608,553 | 8/1986 | Ormond | |
| 4,999,634 | 3/1991 | Brazdrum et al. | 341/172 |

Primary Examiner—Sharon D. Logan
Attorney, Agent, or Firm—Nathan N. Kallman

[57] ABSTRACT

An analog-to-digital converter converts multiple analog signals to multiple digital signals during a single conversion period. The converter comprises a multiple input integrator stage which provides an output voltage that is selectively compared to a multiplicity of voltages. The comparison voltages include reference voltages and additional signal inputs. A plurality of UP counters measure the number of clock pulses generated by a clock generator and enable the calculation of the output function.

7 Claims, 5 Drawing Sheets

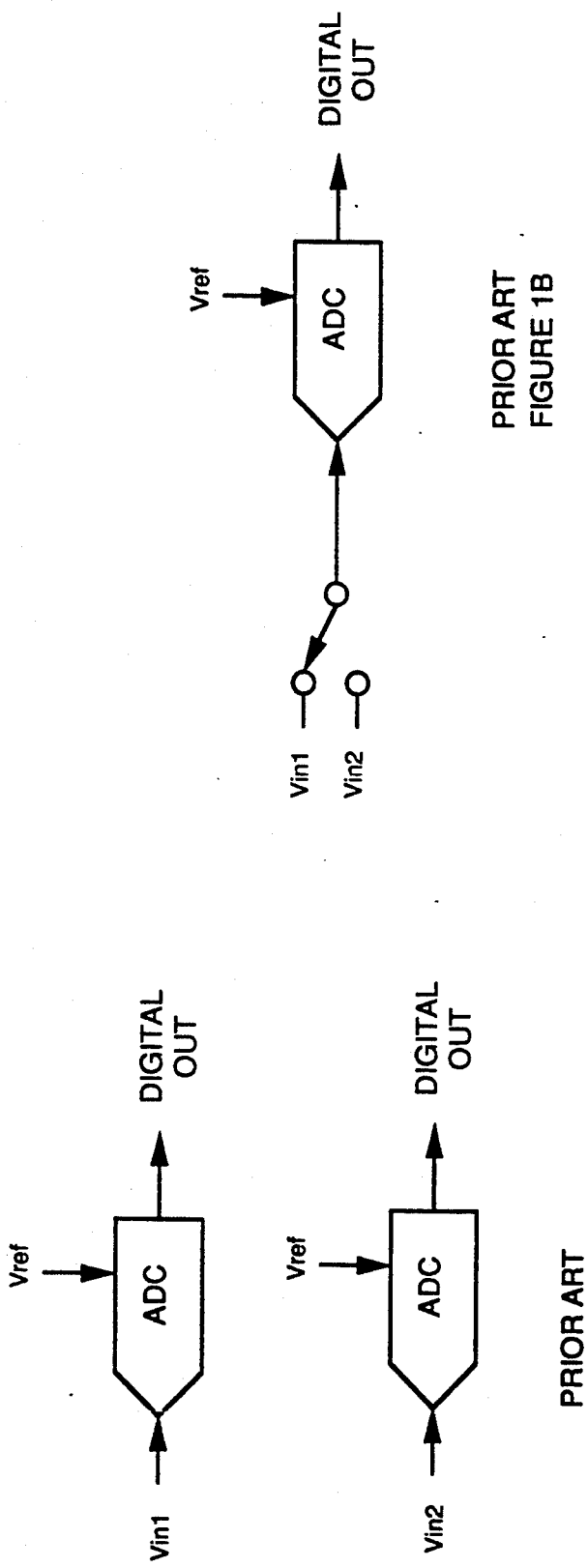

ANALOG TO DIGITAL CONVERTER FOR CONVERTING MULTIPLE ANALOG INPUT SIGNALS TO CORRESPONDING DIGITAL OUTPUT SIGNALS DURING ONE CONVERSION CYCLE

CROSS-REFERENCE TO COPENDING PATENT APPLICATION

Copending U.S. patent application Ser. No. 07/829,230, filed Feb. 3, 1992 on behalf of M. Hanlon, and assigned to the same assignee, discloses an integrating ratiometric analog-to-digital converter. The subject matter of the copending application is incorporated herein by reference.

FIELD OF THE INVENTION

This invention relates to analog-to-digital converters (ADCs) of the integrating type and in particular to an ADC that converts a plurality of independent analog voltage signals to corresponding digital data during a single conversion cycle.

DESCRIPTION OF THE PRIOR ART

Prior art ADCs generally function to convert one analog input voltage signal to one output digital signal, usually comprising a plurality of binary bits. If a plurality of independent analog signals are to be converted concurrently during the period of one conversion cycle, it is necessary to employ a plurality of ADCs which operate in parallel. This has the advantage of providing the plurality of output signals during one conversion cycle but has the disadvantage of requiring multiple ADCs, as shown in FIG. 1A, which are expensive functional components, especially when improving accuracy of the circuit or increasing the number of binary bits being processed.

As shown in FIG. 2B and FIG. 4B, a complete conversion cycle is equal to the sum of the time periods $t_1$ and $t_2$. As implemented in the prior art, only one input signal would be converted during a complete conversion cycle. A multiplexer can then be used to switch the ADC input circuit to receive a second input signal. The conversion of the second input signal also requires a total time period of $t_1+t_2$. Another approach employs two ADCs. This would allow the conversion of both input signals in one conversion cycle, but at the cost of completely duplicating an ADC.

An alternate approach to converting a plurality of analog voltage signals is to employ a time multiplexing technique in which a multi-position multiplexer is provided at the ADC input, as shown in FIG. 1B, so that input analog signals supplied to the multiplexer are sequentially converted to binary data signals. This of course reduces the overall cost of providing a plurality of ADCs but has the disadvantage of increasing the conversion time in proportion to the number of input signals to be converted.

SUMMARY OF THE INVENTION

An object of this invention is to provide an improved integrating type ADC.

Another object of the invention is to provide an ADC for concurrently converting a plurality of analog input voltages.

Another object is to provide an ADC in which a plurality of analog input voltages are converted during one conversion cycle.

In accordance with the invention, an ADC includes a multiplexer for effectuating switching between a plurality of analog input voltage signals and a logic circuit associated with a comparator stage for controlling the multiplexer. The plurality of analog signals are converted to a multiplicity of digital signals during one conversion cycle of the ADC.

In one embodiment of a single input integrating ADC, an integrator stage comprises an operational amplifier (Op Amp) having one input grounded and the other input connected to a summing junction. The analog input signal is supplied from the analog input terminal to the summing junction through one resistor, while a two position switch alternately supplies a positive or a negative reference voltage to the summing junction through a second resistor. The output of the integrating stage is supplied to the comparator stage, where it is compared respectively to two trip voltages. The output of each comparator of the comparator stage switches a multivibrator from a set state to a reset state when the output of the integrating stage equals one of the trip voltages. The output of the multivibrator controls the two position switch for supplying the reference voltages to the summing junction to cause the switch to change position when the multivibrator changes state. The transfer function of the ADC is given by the equation $(t1-t2)/(t1+t2) = Vin/Vref$. By changing the ratio of resistor values, a virtual gain is created and the transfer function becomes $(t1-t2)/(t1+t2) = (G * Vin)/Vref$.

In the cross-referenced application mentioned above, an ADC is illustrated in which switched capacitors are employed to obtain a similar transfer function, the main difference being that the output voltage of the integrator stage moves up and down in small discrete steps since the switching frequency and capacitor sizes can be selected to achieve such a result. In the referenced application, a time multiplexed single comparator is used to provide two trip voltages alternately to a comparator under control of logic which determines when the position of the switch is reversed. The transfer function is $(t1-t2)/(t1+t2) = K1\ G\ Vin/Vref$, where K1 is the ratio of the switched capacitors. By modifying the multiplexer to accommodate one or more additional pairs of switching points, each of which is supplied with an independent input voltage signal to be converted, and additional logic to determine which switch position will occur next, it is possible to convert concurrently a plurality of analog input signals in one conversion cycle, since the transfer function becomes $(t3+t4)/(t1+t2) = Vin2/Vref$ where $Vref = Vtrip2 - Vtrip1$. The above transfer function can be generalized for multiple inputs as follows for the nth input:

$$(t(2n-1)+t2n)/t1+t2 = Vinn/Vref$$

where $Vref = Vtrip2 - Vtrip1$.

DESCRIPTION OF THE DRAWING

The invention will be described in greater detail with reference to the figures of the drawing in which:

FIGS. 1A and 1B illustrate representations of prior art ADC circuits for converting a plurality of analog voltage signals during one conversion cycle of an integrating type ADC;

FIG. 3 is a schematic circuit diagram of the ADC shown in the cross-referenced application in which the transfer function is the same as that shown in FIG. 2a;

DESCRIPTION OF THE PREFERRED EMBODIMENT

Prior art techniques for converting a plurality of analog voltages are shown schematically in FIGS. 1A and 1B. In FIG. 1A, two separate ADCs operate in a parallel time fashion to convert Vin1 and Vin2 to digital output signals. In FIG. 1B, a multi-input multiplexer switch MS connects the two input voltages Vin1 and Vin2 serially to the ADC. The respective digital output signals are also provided serially.

Figure 2A:
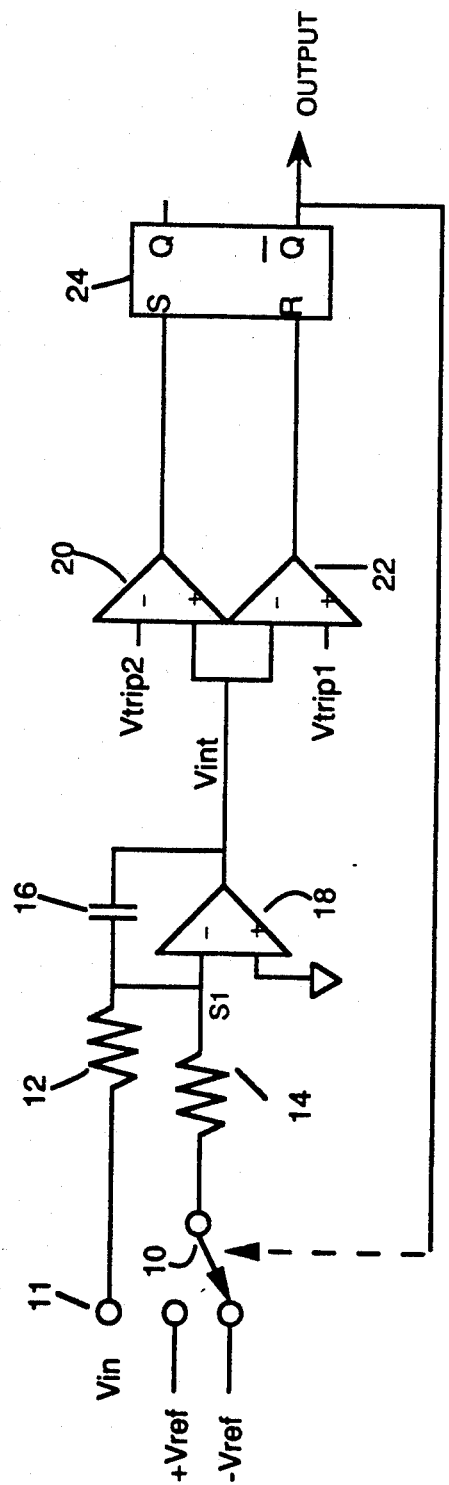
FIG. 2A is a schematic circuit diagram of a single ended integrating type ADC having a transfer function with operating characteristics similar to the transfer function of the preferred embodiment of the present invention.

FIG. 2A illustrates an integrating type ADC circuit in a simplified form. As shown in FIG. 2A, the circuit includes an integrator comprising op amp 18, a capacitor 16, a pair of resistors 12 and 14, a switching element 10 and a pair of reference voltages +Vref and −Vref. An input voltage Vin to be measured is supplied at input terminal 11 which is connected to a summing junction S1 through resistor 12. One of the reference voltages +Vref or −Vref is selectively connected to summing junction S1 through resistor 14 by means of switch 10.

The ADC further includes a comparator stage comprising comparators 20 and 22 whose outputs are connected respectively to the set and reset terminals of a multivibrator 24. The output of multivibrator 24 is fed back to switch 10 so as to position switch 10 in accordance with the set or reset state of the multivibrator 24. A pair of trip voltages Vtrip1 and Vtrip2 are supplied respectively to one input of the comparators 22 and 20, while the output of the integrator Op Amp 18 is supplied to the other terminal of comparators 20 and 22.

Figure 2B:
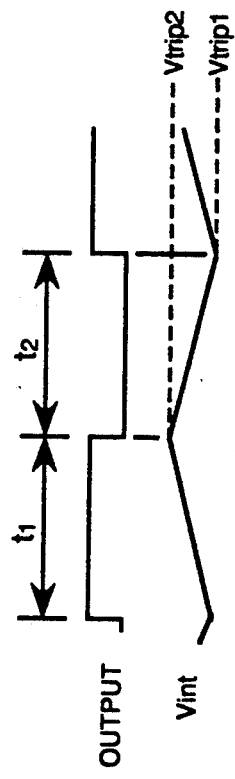
FIG. 2B is a waveform representation of the integrator and output voltage versus time of the ADC circuit shown in FIG. 2A.

The operation of the simplified circuit shown in FIG. 2A is as follows:

Assume that an input voltage Vin, within a defined range is applied to input terminal 11 and that the switch 10 is in the position shown in FIG. 2A. A current will flow through resistor 12 proportional to Vin. Another current will flow through resistor 14 proportional to −Vref. The algebraic sum of the currents will flow through capacitor 16. Because Vin is bounded, the absolute value of current caused by −Vref can be made larger than the absolute value of the current caused by Vin. The output of op amp 18 therefore increases until the voltage reaches the level of Vtrip2 at comparator 20. At this point the multivibrator 24 is set which causes the switch 10 to move to the other position. The current caused by +Vref flowing through resistor 14 now adds to the current from the input voltage. The output voltage of op amp 18 therefore begins to decrease as shown in FIG. 2B. When the output voltage decreases to the level of Vtrip1, the multivibrator 24 is reset which causes switch 10 to return to its original position. The cycle is then repeated. The transfer function of the ADC assuming that resistors 12 and 14 are of equal value, is $$(t1-t2)/(t1+t2) = Vin/Vref$$

By changing the ratio of the values of resistors 12 and 14 a virtual gain is created and the transfer function becomes $$(t1-t2)/(t1+t2) = (G*Vin)/Vref$$

Figure 3:
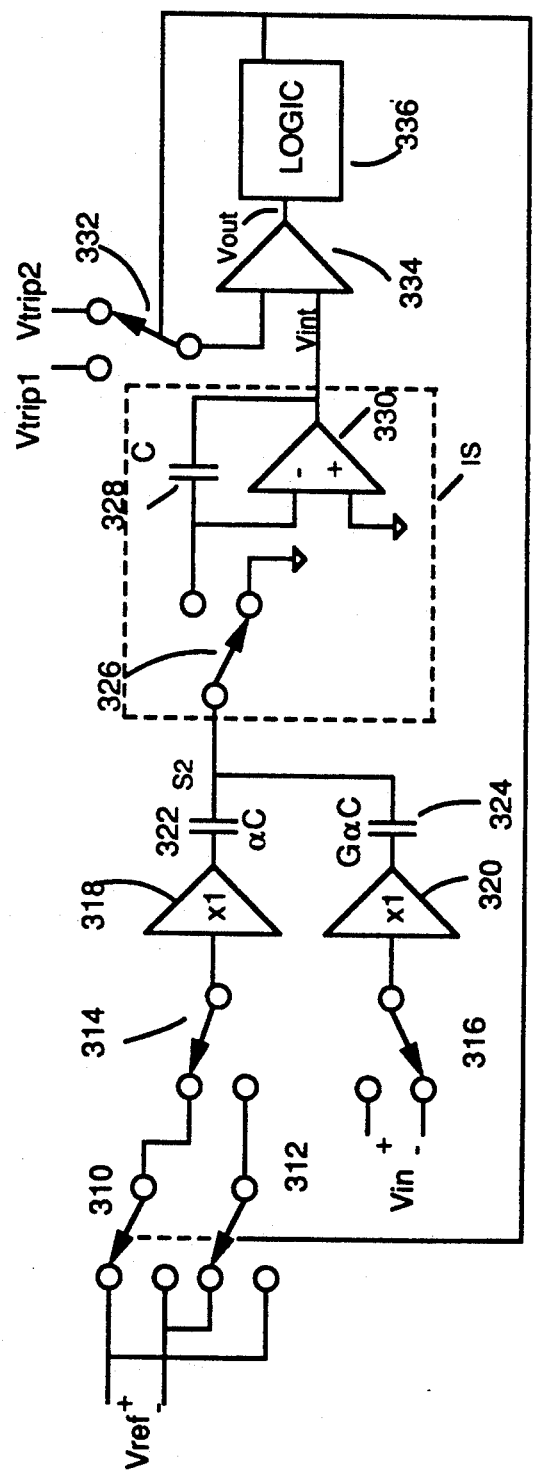

FIG. 3 shows schematically a single ended, half circuit version of an integrating type ADC, in accordance with this invention, which has the same transfer function as the arrangement shown in FIG. 2A.

The circuit shown in FIG. 3 comprises a pair of single input unity gain buffers 318 and 320. Buffer 318 has its input connected to positive and negative terminals of a reference voltage source Vref by means of switches 310 and 314. Switch 310 connects the positive Vref terminal to one terminal of switch 314 while switch 312 connects the negative Vref terminal to the other terminal of switch 314. A high frequency four phase clock (not shown) controls the operation of switch 314 as well as switches 316 and 326. A number of UP counters measure the number of clock pulses generated by the clock generator during t1 and t2 to enable the calculation of the duty cycle. Each conversion period comprises two time periods t1 and t2, as illustrated in FIG. 2B.

Buffer 320 is connected to the pair of input voltage terminals by switch 316 which is activated by the four phase clock that also controls switch 314. The output of buffer 318 is connected to summing junction S2 through capacitor 322. The output of buffer 320 is connected to summing junction S2 through capacitor 324. The buffers 318 and 320 can be open loop voltage followers, for example, as well as single unity gain op amps.

The circuit shown in FIG. 3 comprises an integrator stage IS (shown enclosed in a dotted line block) including op amp 330 and capacitor 328. Summing junction S2 is connected to input switch 326 of the integrator stage. Switch 326 is controlled by the four phase clock source (not shown). During the other clock phase, switch 326 connects the summing junction S2 to the input of op amp 330.

The means for controlling switches 310, 312 and 332 as shown in FIG. 3 comprise the comparator 334, the logic circuit 336, the switch 332 and the pair of trip voltages Vtrip1 and Vtrip2.

The operation of the circuit shown in FIG. 3 is as follows: During clock phase 1, the switches are as shown in FIG. 3. A charge is stored on capacitor 322 equal to $\propto$ CVref+ and a charge is stored on capacitor 324 equal to G $\propto$ CVin−.

During clock phase 3, switches 314, 316, and 326 are switched to their other positions. The charge on capacitor 328 across op amp 330 is equal to the previous charge, plus the incremental charge added by the function of the relative values of capacitors 322, 324, and 328.

During clock phases 2 and 4, switches 314, 316 and 326 are open circuit, connecting to neither terminal.

With continued alternating phases of the clock, the output voltage of the integrator Op Amp 330 increases at a rate proportional to (Vref−Vin). The output voltage increases until it reaches the level of Vtrip2, which causes the output of the comparator 334 to change state.

The logic 336 then causes each of the switches 310, 312 and 332 to assume the other position. The output voltage of integrator stage 330 then starts to decrease at a rate proportional to (Vin+Vref). The decrease continues until it reaches the level of Vtrip1 which causes the comparator 334 to return to its previous state. Switches 310, 312 and 332 likewise revert to their initial positions which are as shown in FIG. 3.

By changing the coefficients α, and G, the resolution of the ADC function and the gain of the virtual amplifier function can be independently adjusted. The details of this adjustment are discussed in the above cross-referenced application.

The values of capacitors 322, and 324 can be changed selectively by any of the digitally controlled switching techniques known in the prior art.

Figure 4A:
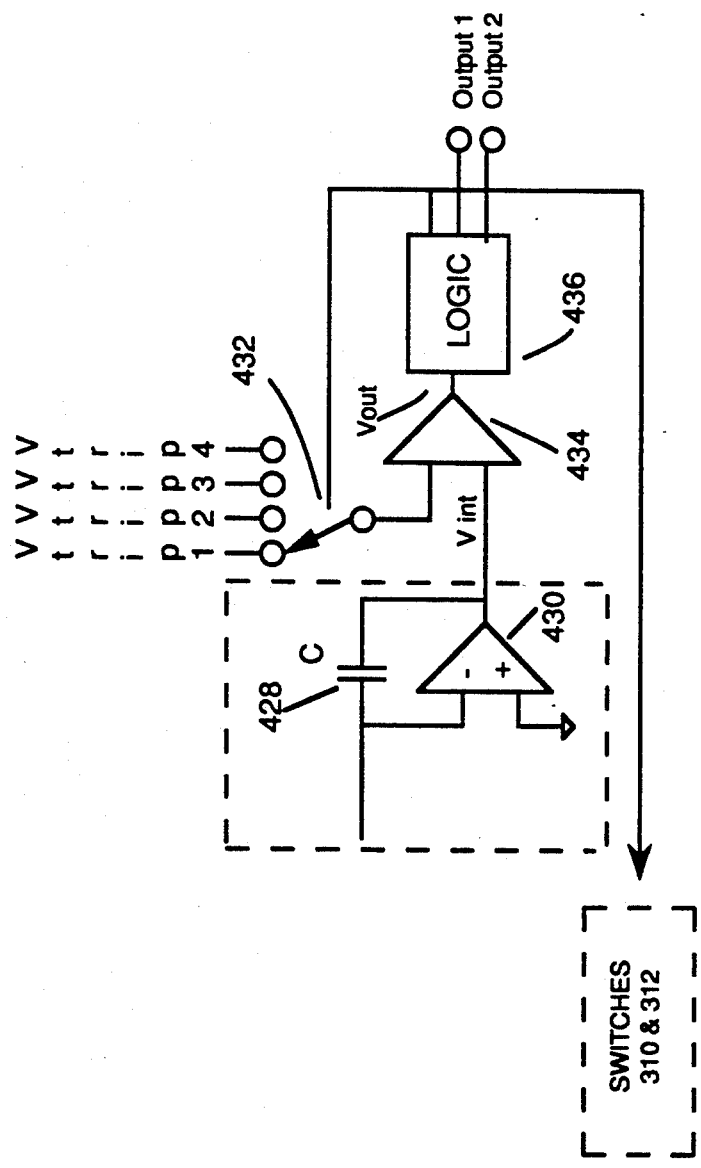
FIG. 4A is a schematic circuit diagram of a modification of the comparator stage shown in the ADC of FIG. 3.

FIG. 4A illustrates a modification of the integrator stage shown in FIG. 3. The modification involves changes to the logic block 336 which function to control switch 432 and switches 310 and 312 that are employed to switch reference voltage Vref. A four position switch 432 is substituted for the two position switch 332. Switch 432 functions to selectively connect Vtrip1—Vtrip4 to one input of comparator 434.

Figure 4B:
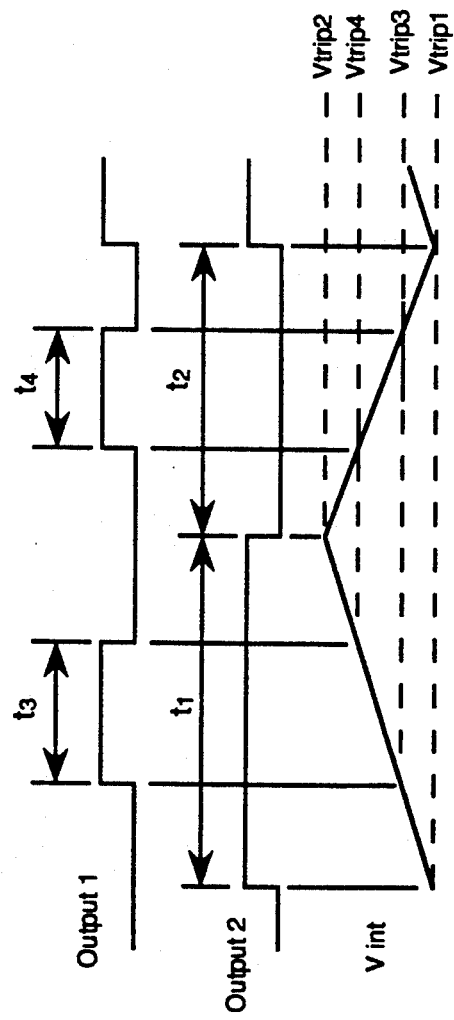
FIG. 4B is a waveform representation of the integrator and output voltage versus time of the ADC circuit shown in FIG. 4A.

The operation of the circuit of FIG. 4A is as follows:

As the integrator output starts to ramp as shown in FIG. 4B, the logic switches multiplexer switch 432 to the Vtrip 3 position. As the ramp reaches the trip level 3 voltage, the logic 436 switches the multiplexer switch to the Vtrip4 position. When the ramp reaches the Vtrip4 voltage, the logic switches the multiplexer 432 to the Vtrip2 position. Finally when the ramp reaches the Vtrip2 level, the logic switches multiplexer 432 back to trip level 4 position and also changes the positions of the input switches 310 and 312.

Due to the monotonically increasing or decreasing voltage of the integrator output, the logic required to decode the information at the output of the comparator and to control the switches can be implemented with a number of different techniques. One approach uses three flip-flops and three counters. The first flip-flop, such as shown in FIG. 2A, has an output that is high during the period $t_1$. The second flip-flop has an output that is high during $t_3$ or $t_4$. The third flip-flop is high during $t_1$ and $t_2$, and is reset for a short time period when the negative-going ramp reaches Vtrip1. The three flip-flops enable the three counters so that a digital word, proportional to time, is obtained for further processing by the external system. In an alternative embodiment, the third flip-flop is eliminated and an AND gate is used to detect the condition of Vtrip1 and a high frequency clock directly resets the third counter. Knowing the position of multiplexer 432 in FIG. 4A and the output condition of comparator 434, the $t1-t4$ waveforms can be generated, as shown in FIG. 4B.

For the input voltage Vin, the transfer function is $$(t1-t2)/(t1+t2) = G\, Vin/Vref$$

By the method of similar triangles, it can be shown that if a second input Vin2 is defined as Vtrip4—Vtrip3, then the corresponding transfer function is $$(t3+t4)/(t1+t2) = Vin2/Vref2$$

where Vref2 is defined as Vtrip2—Vtrip1.

As Vin1 changes, the slopes of the increasing ramp and the decreasing ramp will change in such a manner that the increase or decrease in time period t3 will be exactly offset by the decrease or increase in time period t4. Thus the sum of periods t3+t4 is independent of Vin1.

The novel simplified ADC disclosed herein converts a plurality of analog signals to a digital signal with a minimum of circuit components within a time period that is equivalent to that required for conversion of a single analog voltage signal. There is no need with this invention to provide complete duplication of an ADC or additional ADC circuitry in order to convert multiple input signals during a single conversion cycle.

What is claimed is:

1. An analog-to-digital converter for converting a multiplicity of analog signals to a multiplicity of digital signals during one conversion period comprising:
   means for providing a multiplicity of analog input signals;
   means for providing positive and negative reference signals, including a first switching means;
   first and second capacitors coupled respectively to said input signal providing means and said reference signal providing mean, said capacitors being connected at a summing junction;
   an integrator stage coupled to said summing junction;
   a comparator coupled to the output of said integrator stage;
   means including second switching means for providing trip voltages to said comparator for switching the states of said comparator;
   logic means coupled to the output of said comparator for controlling the positions of said first and second switching means.

2. An analog-to-digital converter as in claim 1, including
   a first buffer amplifier coupled to said reference signal providing means;
   a second buffer amplifier coupled to said input signal providing means;
   third switching means coupled between said first switching means and said first buffer amplifier;
   fourth switching means coupled to the input of said second buffer amplifier; and
   fifth switching means coupled between said summing junction and said integrator stage.

3. An analog-to-digital converter as in claim 2, including clock means for providing different clock phases to switch said third, fourth and fifth switching means.

4. An analog-to-digital converter as in claim 3, wherein said clock means is a high frequency four phase clock for switching said third, fourth and fifth switching means between alternate positions.

5. An analog-to-digital converter as in claim 2, wherein said first and second buffer amplifiers are single input unity gain operational amplifiers.

6. An analog-to-digital converter as in claim 1, wherein said trip voltages providing means provides four trip voltages to said comparator.

7. An analog-to-digital converter as in claim 2, wherein said first and second buffer amplifiers are open loop voltage followers.

* * * * *